US011217684B2

(12) United States Patent
Chen

(10) Patent No.: US 11,217,684 B2
(45) Date of Patent: Jan. 4, 2022

(54) METHOD FOR RAPIDLY GATHERING SUB-THRESHOLD SWING FROM THIN FILM TRANSISTOR

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 228 days.

(21) Appl. No.: 16/416,264

(22) Filed: May 19, 2019

(65) Prior Publication Data

US 2020/0365714 A1 Nov. 19, 2020

(51) Int. Cl.

| | |
|---|---|
| ***G01R 31/26*** | (2020.01) |
| ***H01L 29/73*** | (2006.01) |
| ***H03K 17/12*** | (2006.01) |
| ***H03F 3/45*** | (2006.01) |
| ***H01L 29/786*** | (2006.01) |
| ***H01L 29/66*** | (2006.01) |
| ***H01L 21/66*** | (2006.01) |

(52) U.S. Cl.

CPC .......... *H01L 29/7317* (2013.01); *G01R 31/26* (2013.01); *G01R 31/2621* (2013.01); *H01L 22/14* (2013.01); *H01L 29/66265* (2013.01); *H01L 29/786* (2013.01); *H03F 3/4508* (2013.01); *H03K 17/122* (2013.01)

(58) Field of Classification Search

CPC ... H01L 29/7317; H01L 22/14; H01L 29/786; H01L 29/66265; G01R 31/26; G01R 31/2621; H03K 17/122; H03F 3/4508; H03F 2203/45518; H03F 3/45475

See application file for complete search history.

(56) References Cited

U.S. PATENT DOCUMENTS

| | | | | |
|---|---|---|---|---|
| 4,109,165 A * | 8/1978 | Katakura | .............. | G01R 19/02 324/132 |
| 5,473,279 A * | 12/1995 | D'Angelo | ................. | G06J 1/00 327/100 |
| 2006/0047474 A1* | 3/2006 | Hyde | ..................... | G01N 27/18 702/182 |

(Continued)

OTHER PUBLICATIONS

Bianka Ullmann, 'Mixed Negative Bias Temperature Instability and Hot-Carrier Stress', Bianka Ullmann, Ph.D. Dissertation, Article 3.5, pp. 1/15, 4/15, May 28, 2018. (Year: 2018).*

(Continued)

*Primary Examiner* — S M Sohel Imtiaz
(74) *Attorney, Agent, or Firm* — CKC & Partners Co., LLC

(57) ABSTRACT

A method for rapidly gathering a sub-threshold swing from a thin film transistor is provided. The method includes: electrically connecting an operational amplifier and an anti-exponential component to a source terminal of the thin film transistor; performing a measuring process to the thin film transistor in which the measuring process is inputting multiple values of a gate voltage to a gate terminal, such that multiple values of an output voltage are correspondingly generated from the output terminal of the operational amplifier; and performing a fitting process to the output voltage corresponding to the thin film transistor in which the fitting process is fitting at least two of said multiple values of the output voltage to get the sub-threshold swing.

10 Claims, 9 Drawing Sheets

300
100A
130
C(e3) E(e2)
B(e1)
110
IP1
IP2
O
Vo1
R1
R2
Vo
Vg
G
S
D
Vd
VCM
120
130'
IP1"
IP2"
O"
120"
100A'
Iref
IP1'
IP2'
O'
Vo2
R3
R4
Rf
120'
VSS
Vref
VCM

(56) References Cited

U.S. PATENT DOCUMENTS

| | | | | |
|---|---|---|---|---|
| 2010/0044687 | A1* | 2/2010 | Kalb | H01L 21/0212 257/40 |
| 2011/0209567 | A1* | 9/2011 | Sugawa | G01R 31/275 73/866.3 |
| 2014/0005390 | A1* | 1/2014 | Gade | C07D 487/06 544/245 |
| 2017/0330938 | A1* | 11/2017 | Baeck | H01L 29/1054 |
| 2018/0033858 | A1* | 2/2018 | Moon | H01L 29/22 |
| 2018/0061994 | A1* | 3/2018 | Shi | H01L 27/1214 |
| 2019/0391206 | A1* | 12/2019 | Lin | G06F 30/367 |
| 2020/0200816 | A1* | 6/2020 | Panakkal | G05F 3/262 |

OTHER PUBLICATIONS

M. Wong et al., 'Analysis of the Subthreshold Slope and the Linear Transconductance Techniques for the Extraction of the Capacitance Coupling Coefficients of Floating-Gate Devices', IEEE Electron Device Letters, vol. 13, pp. 566-568, 1992. (Year: 1992 ).*

Molugaram et al., 'Method of Least Square', Statistical Technique for Transportation Engineering, ISBN 978-0-12-811555-8, Chapter—5, pp. 281-292, 2017. (Year: 2017).*

* cited by examiner

100

100B

METHOD FOR RAPIDLY GATHERING SUB-THRESHOLD SWING FROM THIN FILM TRANSISTOR

BACKGROUND

Field of Invention

The present disclosure relates to a method for rapidly gathering a sub-threshold swing from a thin film transistor.

Description of Related Art

The statements in this section merely provide background information related to the present disclosure and do not necessarily constitute prior art.

In recent years, researches on various new types of display devices are blossoming. Some types of display devices use thin film transistors as switches and/or driving components for illuminate pixels. As characteristic sizes of electronic components in one display device gradually shrink down, uniformity of fabrication conditions on single display device becomes an important issue, so as to provide high quality and a highly controllable illumination condition.

SUMMARY

According to some embodiments of the present disclosure, a method for rapidly gathering a sub-threshold swing from a thin film transistor is provided. The method includes: electrically connecting an operational amplifier and an anti-exponential component to a source terminal of the thin film transistor, in which a first end of the anti-exponential component is electrically connected to a inverting input terminal of the operational amplifier, a second end of the anti-exponential component is electrically connected to an output terminal of the operational amplifier, and a non-inverting input terminal of the operational amplifier is electrically connected to a common mode voltage; performing a measuring process to the thin film transistor, in which the measuring process is inputting multiple values of a gate voltage to a gate terminal, such that multiple values of an output voltage are correspondingly generated from the output terminal of the operational amplifier; and performing a fitting process to the output voltage corresponding to the thin film transistor, in which the fitting process is fitting at least two of said multiple values of the output voltage to get the sub-threshold swing.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
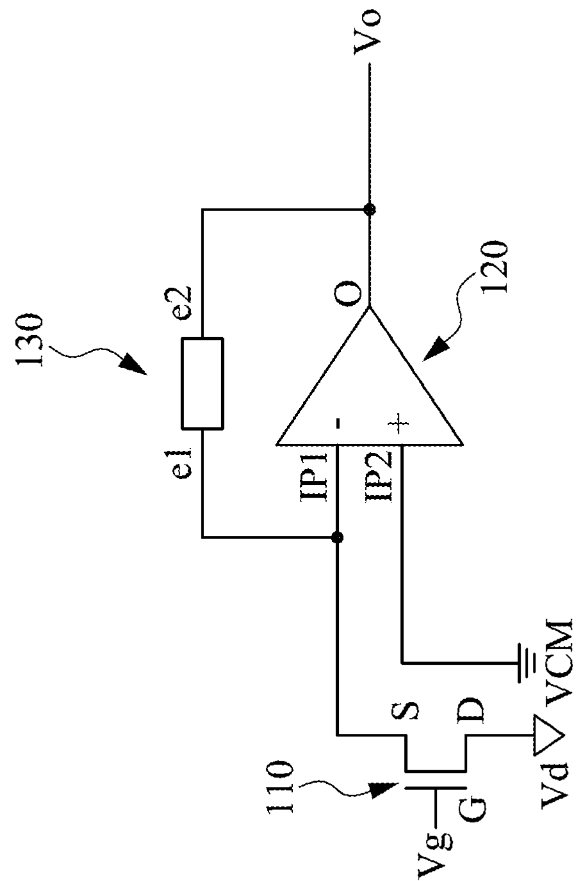
FIG. 1 is a schematic diagram of a measuring circuit according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "according to some embodiments" or the like in various places throughout this specification are not necessarily referring to the same embodiment of the disclosure. Furthermore, the particular features, structures, configurations, or characteristics may be combined in any suitable manner in one or more embodiments.

Figure 2:
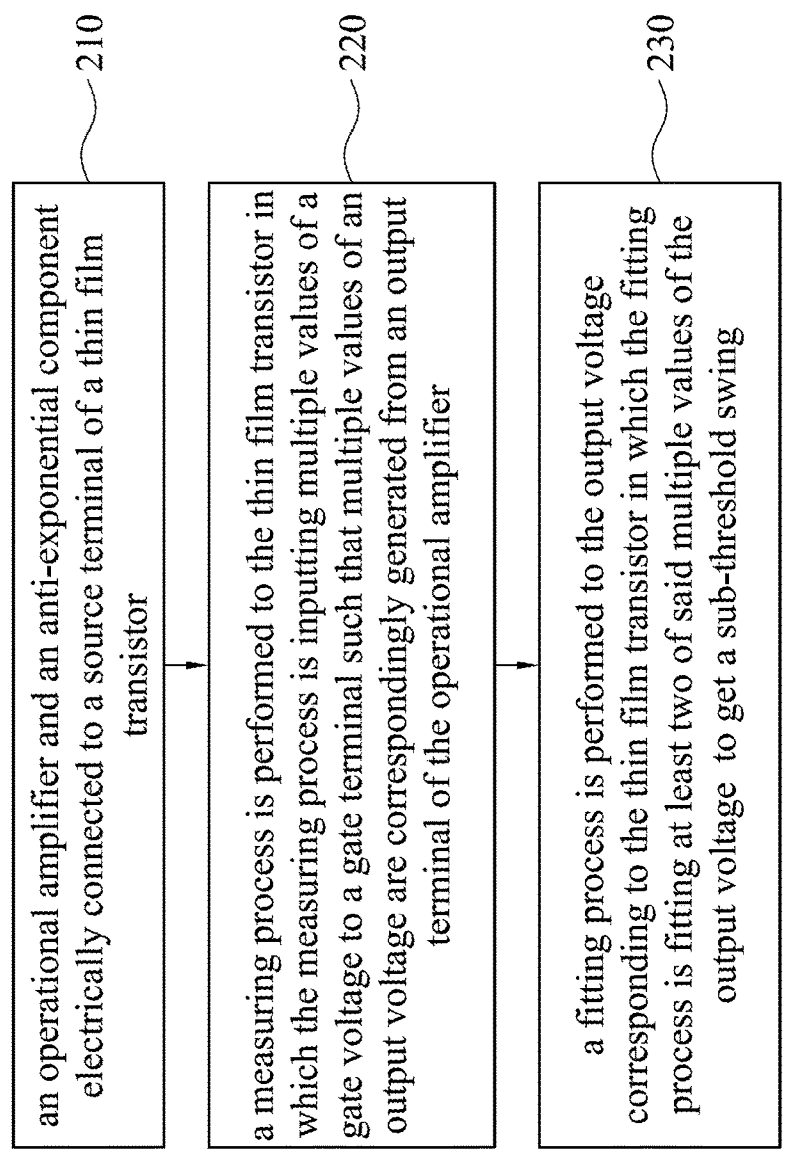
FIG. 2 is a flow chart of a method for rapidly gathering a sub-threshold swing from a thin film transistor according to some embodiments of the present disclosure.

FIG. 1 is a schematic diagram of a measuring circuit 100 according to some embodiments of the present disclosure. FIG. 2 is a flow chart of a method 200 for rapidly gathering a sub-threshold swing SS from a thin film transistor 110 according to some embodiments of the present disclosure. Reference is made to FIGS. 1 and 2. The method 200 begins with operation 210 in which an operational amplifier 120 and an anti-exponential component 130 are electrically connected to a source terminal S of the thin film transistor 110. In some embodiments, a first end e1 of the anti-exponential component 130 is electrically connected to a inverting input terminal IP1 of the operational amplifier 120. A second end e2 of the anti-exponential component 130 is electrically connected to an output terminal O of the operational amplifier 120. A non-inverting input terminal IP2 of the operational amplifier 120 is electrically connected to and configured to receive a common mode voltage VCM. The common mode voltage VCM can be grounded, but should not be limited thereto. In some embodiments, a drain terminal D of the thin film transistor 110 is electrically connected to and configured to receive an applied voltage Vd (i.e., an input voltage), but should not be limited thereto. In some embodiments, a channel of the thin film transistor 110 is made of hydrogenated amorphous silicon (a-Si:H), indium gallium zinc oxide (IGZO), gallium zinc oxide (GZO), or indium zinc oxide (IZO), but should not be limited thereto.

The "electrically connected" as mentioned in the embodiments of the present disclosure can be "directly connected", but should not be limited thereto. Some minor electronic components (e.g., resistors, in some circumstances) which do not affect operations and results as disclosed in the embodiments of the present disclosure can be present between two electrically connected components, and can be incorporated into the meaning of the "electrically connected" in the scope of the present disclosure.

The method 200 continues with operation 220 in which a measuring process is performed to the thin film transistor 110. The measuring process is inputting multiple values of a gate voltage Vg to a gate terminal G of the thin film transistor 110 such that multiple values of an output voltage Vo are correspondingly generated from the output terminal O of the operational amplifier 120. In some embodiments, a range of the multiple values of the gate voltage Vg is chosen such that a current flowing through the thin film transistor 110 is within a range from about 1 femtoamp (fA) to about 1 milliamp (mA), which corresponds to a general operation range for the thin film transistor 110.

The method 200 continues with operation 230 in which a fitting process is performed to the output voltage Vo corresponding to the thin film transistor 110, in which the fitting process is fitting at least two of said multiple values of the output voltage Vo to get the sub-threshold swing SS of the thin film transistor 110. The sub-threshold swing SS is found to be an index relating the quality of the channel of the thin film transistor 110. The smaller the sub-threshold swing SS is, the smaller the voltage change required to drive carriers within the channel due to fewer trap states, and thus the higher ability for a gate to control (ON/OFF of) the channel. In some embodiments, a range of the multiple values of the gate voltage Vg for the fitting is chosen within a range where a corresponding current flowing through the thin film transistor 110 is within a range from about 0.01 picoamp (pA) to about 0.1 microamp (pA), which is the range within which a subthreshold conduction is likely to occur. In some embodiments, the fitting is performed by a least square method, but should not be limited thereto. Specifically, the acquired data points that constitute a current-to-voltage (gate voltage) curve are fitted by a straight line (using logarithmic current value) in which a sum of squares of each differences between data points and the corresponding points on the straight line is minimized. A slope (i.e., a sub-threshold slope) of said straight line is regarded as a reciprocal value of the sub-threshold swing SS.

Figure 3A:
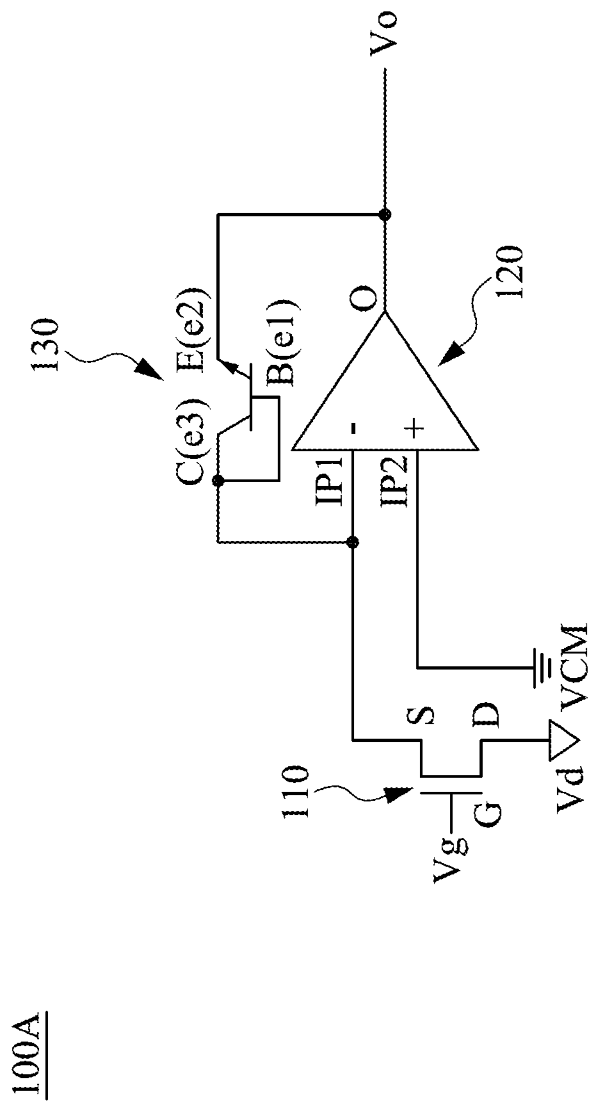
FIG. 3A is a schematic diagram of a measuring circuit according to some embodiments of the present disclosure.
Figure 3B:
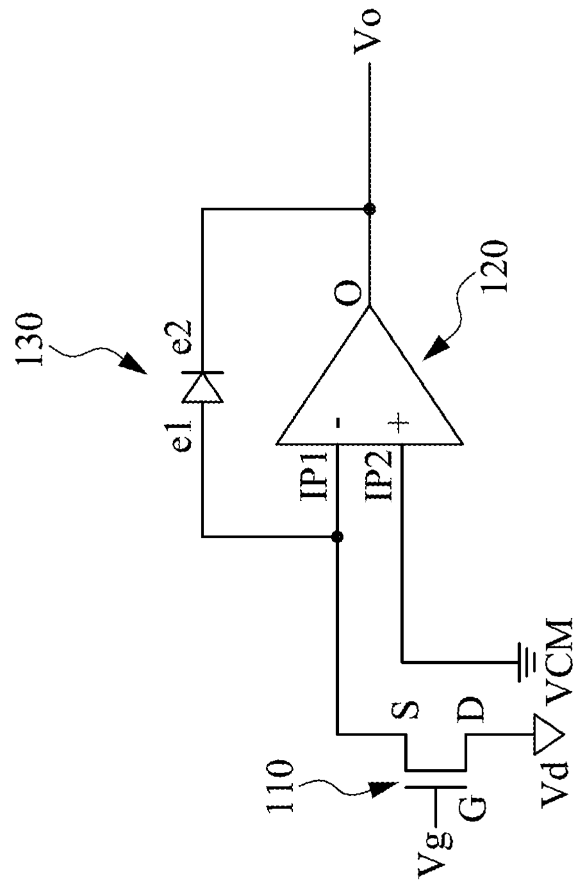
FIG. 3B is a schematic diagram of a measuring circuit according to some embodiments of the present disclosure.

Reference is made to FIGS. 3A and 3B. FIG. 3A is a schematic diagram of a measuring circuit 100A according to some embodiments of the present disclosure. FIG. 3B is a schematic diagram of a measuring circuit 100B according to some embodiments of the present disclosure. In some embodiments, the anti-exponential component 130 is a bipolar junction transistor (BJT) (as referred to FIG. 3A). The BJT is adopted because a current (IE) flowing out from an emitter (E) of the BJT is proportional to a voltage difference (VBE) between the emitter (E) and a base (B) of the BJT in an exponential way, i.e., $IE \propto e^{VBE}$. In some embodiments, the anti-exponential component 130 is a diode as referred to FIG. 3B. The diode is adopted because a current (I) flowing through the diode is proportional to a voltage difference (V) crossing the diode in an exponential way, i.e., $I \propto e^{V}$. The above current-to-voltage characteristics can be adopted when a current of an electronic component to be measured spans many orders when varying a small amount of voltage across the electronic component. In the present scenario, a sub-threshold swing SS of the thin film transistor 110 fit the condition as mentioned.

Figure 4A:
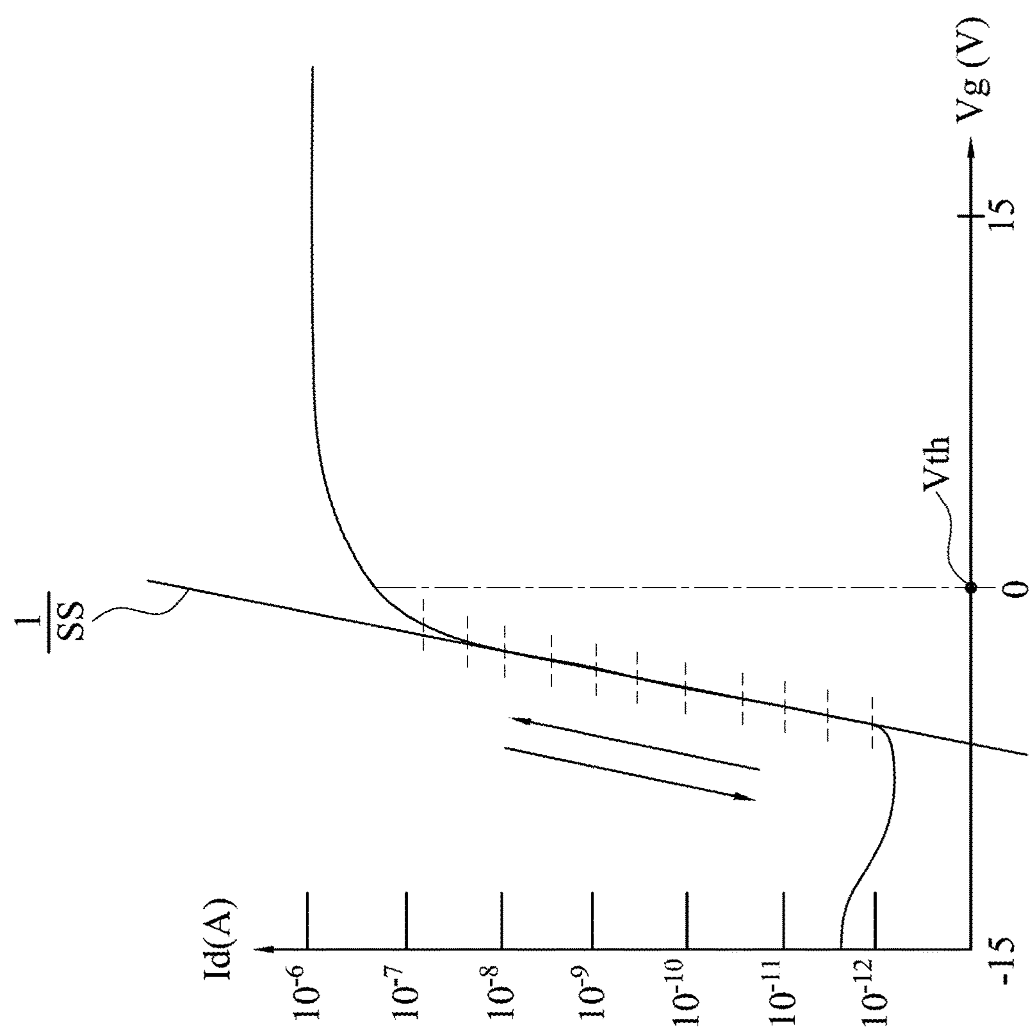
FIG. 4A is a schematic diagram illustrating a current-to-voltage characteristic of a thin film transistor according to some embodiments of the present disclosure.
Figure 4B:
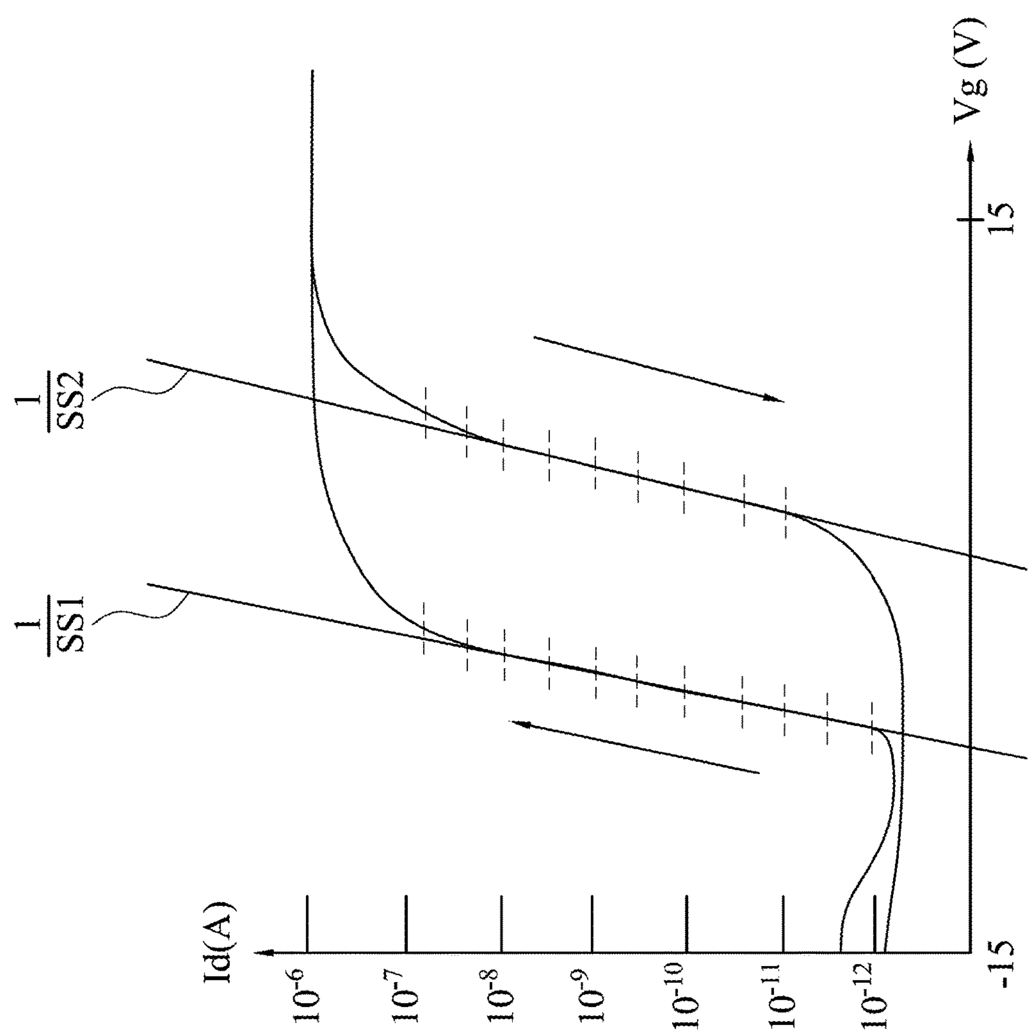
FIG. 4B is a schematic diagram illustrating a current-to-voltage characteristic of a thin film transistor according to some embodiments of the present disclosure.
Figure 4C:
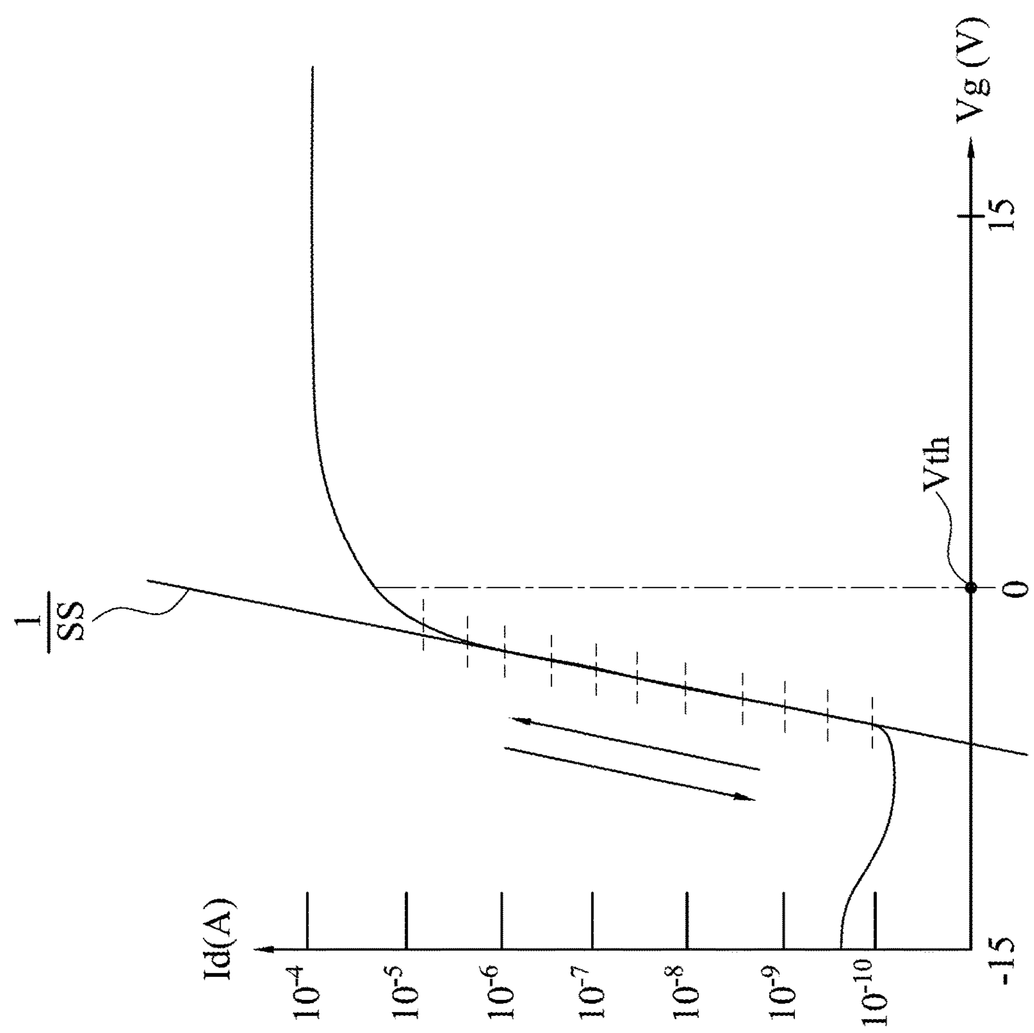
FIG. 4C is a schematic diagram illustrating a current-to-voltage characteristic of a thin film transistor according to some embodiments of the present disclosure.

Reference is made to FIGS. 4A to 4C. FIG. 4A is a schematic diagram illustrating a current (drain-to-source current)-to-voltage (gate voltage) characteristic of the thin film transistor 110 according to some embodiments of the present disclosure. FIG. 4B is a schematic diagram illustrating a current (drain-to-source current)-to-voltage (gate voltage) characteristic of the thin film transistor 110 according to some embodiments of the present disclosure. FIG. 4C is a schematic diagram illustrating another current (drain-to-source current)-to-voltage (gate voltage) characteristic of the thin film transistor 110 according to some embodiments of the present disclosure. The difference between FIG. 4C and FIG. 4A is that a size of the thin film transistor 110 used in the embodiments illustrated by FIG. 4C is greater than a size of the thin film transistor 110 used in the embodiments illustrated by FIG. 4A such that ON and OFF currents in FIG. 4C are about 100 times greater than ON and OFF currents in FIG. 4A to provide greater driving capability in some applications. It is noted that an axis representing drain-to-source current Id (A) is in logarithmic scale in FIGS. 4A to 4C, and the axis representing the applied gate voltage Vg is in linear scale in FIGS. 4A and 4B. Besides, a range of the gate voltage Vg and the value of a threshold voltage Vth as shown in FIGS. 4A to 4C are only exemplifications and should not be limited thereto. In some embodiments, the multiple values of the gate voltage Vg are applied (input) in an increasing order. In some embodiments, the multiple values of the gate voltage Vg are applied (input) in a decreasing order. The above embodiments (increasing order or decreasing order) can be illustrated by FIG. 4A. During swinging (i.e., increasing order or decreasing order) of measurements, a drain-to-source voltage Vds is kept in a value greater than a thermal voltage (~26 mV), such as Vds=75 mV, which is three times of the thermal voltage for better measuring the sub-threshold swing SS. In some embodiments, the drain-to-source voltage Vds is set as 0.1 volt (V). After getting enough number of data points (the minimum requirement is two data points, but usually more than two in real measurements, as indicated by dotted horizontal lines in FIGS. 4A and 4B) within a sub-threshold region (i.e., a region of great order of magnitude jumping from, e.g., about $10^{-13}$~$10^{-12}$ amp to about $10^{-8}$~$10^{-7}$ amp), the sub-threshold swing SS can be fitted and calculated. Specifically, the sub-threshold swing SS is a reciprocal value of the slope (i.e., the sub-threshold slope 1/SS) of the Id-to-Vg curve, that is:

$$SS = \frac{\partial Vg}{\partial(\log(Id))} \tag{1}$$

and keeping the drain-to-source voltage Vds to be a constant value. Therefore, those data points can be extracted for fitting the straight line as mentioned above by, e.g., the least square method as mentioned to get the slope (i.e., sub-threshold slope 1/SS), and thus the sub-threshold swing SS (the reciprocal value of the sub-threshold slope 1/SS) can be calculated. Furthermore, by using the method 200 and one of the measuring circuits 100, 100A, and 100B, log (Id) can be directly presented and extracted without scale conversion, which facilitates the fitting of the sub-threshold swing SS. That is, the sub-threshold slope 1/SS can be obtained by directly calculating a slope between the output voltage Vo and the gate voltage Vg.

In some embodiments, the multiple values of the gate voltage Vg are applied and swung in an increasing order and followed by a decreasing order, or vice versa, which can be illustrated by FIG. 4B. A hysteresis phenomenon (i.e., data points are different between the increasing order swing and the following decreasing order swing) as shown in FIG. 4B is due to some of trap states that are filled or emptied during said increasing/decreasing order swing, such as the carrier that fill up or escape from the trap state. The trap states are quantum states that reside in a bandgap of the channel of the thin film transistor 110. In some embodiments, since the channel of the thin film transistor 110 is made of amorphous silicon, there may be much more number and kinds of trap states compared to the crystalized silicon. Some kinds of these trap states are easier to be filled up during said swing operations, so as to change the Id-to-Vg curve and the sub-threshold swing SS of the thin film transistor 110. By swinging forward and backward (i.e., increasing and decreasing) as shown in FIG. 4B and fitting the acquired data points from the forward swing and the backward swing separately, a sub-threshold swing SS1 corresponding to the forward swing and a sub-threshold swing SS2 corresponding to the backward swing are obtained. By comparing the sub-threshold swing SS1 and the sub-threshold swing SS2, more information (e.g., on the trap states) for quality control of the thin film transistor 110 can be extracted, such as an examination of interface trap states which greatly influence the performance of the thin film transistor 110.

Figure 5:
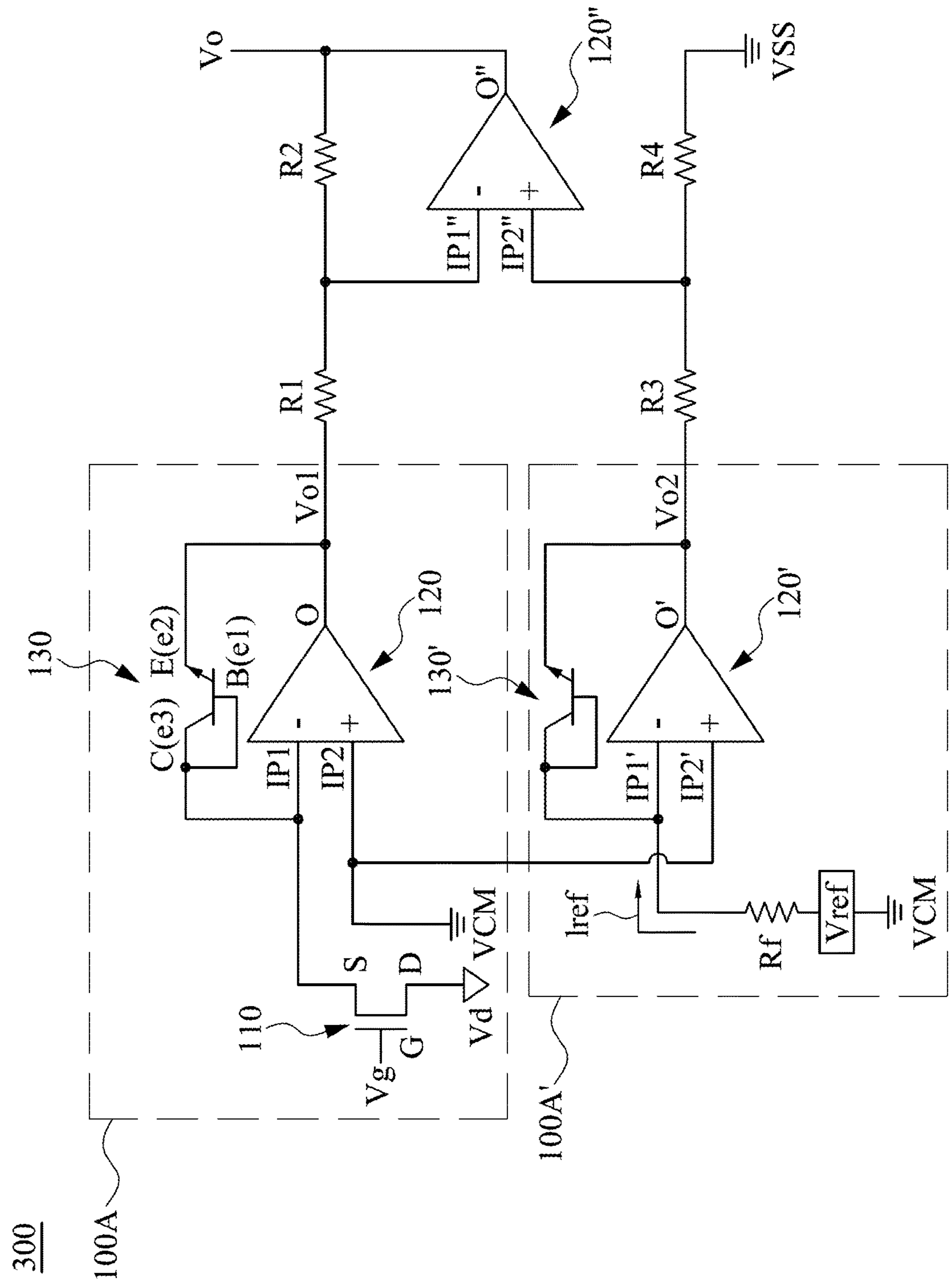
FIG. 5 is a schematic diagram of a measuring circuit according to some embodiments of the present disclosure.

Reference is made to FIG. 5. FIG. 5 is a schematic diagram of a measuring circuit 300 according to some embodiments of the present disclosure. In addition to the measuring circuit 100, 100A, 100B as illustrated by FIGS. 1, 3A, and 3B, additional electronic components can be incorporated therein, so as to further modify functions or enhance precision of measurement. As an example, some embodiments as shown in FIG. 5 illustrate the measuring circuit 300 for compensating a temperature drift (i.e., different output voltages Vo according to different temperature), or specifically subtracting different values of the voltage difference VBE of the anti-exponential component 130 cause by the temperature shift. A non-inverting input terminal IP2' of a reference circuit 100A' is electrically connected to the non-inverting input terminal IP2 of the measuring circuit 100A. An operational amplifier 120' in the reference circuit 100A' can be the same type as the operational amplifier 120 in the measuring circuit 100A. A inverting input terminal IP1' is electrically and separately connected to one end of an anti-exponential component 130' (e.g., a BJT) and one end of a reference resistor Rf. Another end of the anti-exponential component 130' is electrically connected to an output terminal O' of the anti-exponential component 130'. Another end of the reference resistor Rf is electrically connected to one terminal of an internal reference voltage Vref, and another terminal of the internal reference voltage Vref is electrically connected to the common mode voltage VCM. The internal reference voltage Vref is used such that a constant current Iref=Vref/Rf flows to the inverting input terminal IP1' through the reference resistor Rf. An output voltage Vo1 from the output terminal O of the operational amplifier 120 and an output voltage Vo2 from the output terminal O' of the operational amplifier 120' are respectively received by a inverting input terminal IP1" and a non-inverting input terminal IP2" of an operational amplifier 120". An output terminal O" of the operational amplifier 120" outputs the output voltage Vo derived from a difference between the output voltage Vo1 and the output voltage Vo2. Therefore, the temperature drift as mentioned produced by the anti-exponential component 130 can be removed. It is noted that the application as shown in FIG. 5 is an exemplification giving an explicit hint that the measuring circuit 100 can be incorporated into other modified circuits to have better or more functional performances.

In some embodiments, one end of a resistor R1 is electrically connected to the output terminal O of the operational amplifier 120 and the second end e2 of the anti-exponential component 130. The other end of the resistor R1 is electrically connected to the inverting input terminal IP1" of the operational amplifier 120". One end of a resistor R2 is electrically connected to said one end of the resistor R1 and the inverting input terminal IP1" of the operational amplifier 120". The other end of the resistor R2 is electrically connected to the output terminal O" of the operational amplifier 120". One end of a resistor R3 is electrically connected to the output terminal O' of the operational amplifier 120' and the anti-exponential component 130'. The other end of the resistor R3 is electrically connected to the non-inverting input terminal IP2" of the operational amplifier 120". One end of a resistor R4 is electrically connected to the non-inverting input terminal IP2" of the operational amplifier 120" and said one end of the resistor R3. The other end of the R4 is electrically connected to and configured to receive a reference voltage VSS. A voltage level of the reference voltage VSS can be the same as the voltage level of the common mode voltage VCM, but should not be limited thereto. The resistors R1, R2, R3, R4 can be used to tune the amplification between the output voltage Vo and said difference between the output voltage Vo1 and the output voltage Vo2 (i.e., an input voltage in this scenario). For example, when (R2/R1)=(R4/R3), the output voltage Vo equals to (R2/R1)(Vo2−Vo1). A general formula is: Vo=(−R2/R1)Vo1+(1+(R2/R1))(R4/(R3+R4))Vo2.

Figure 6:
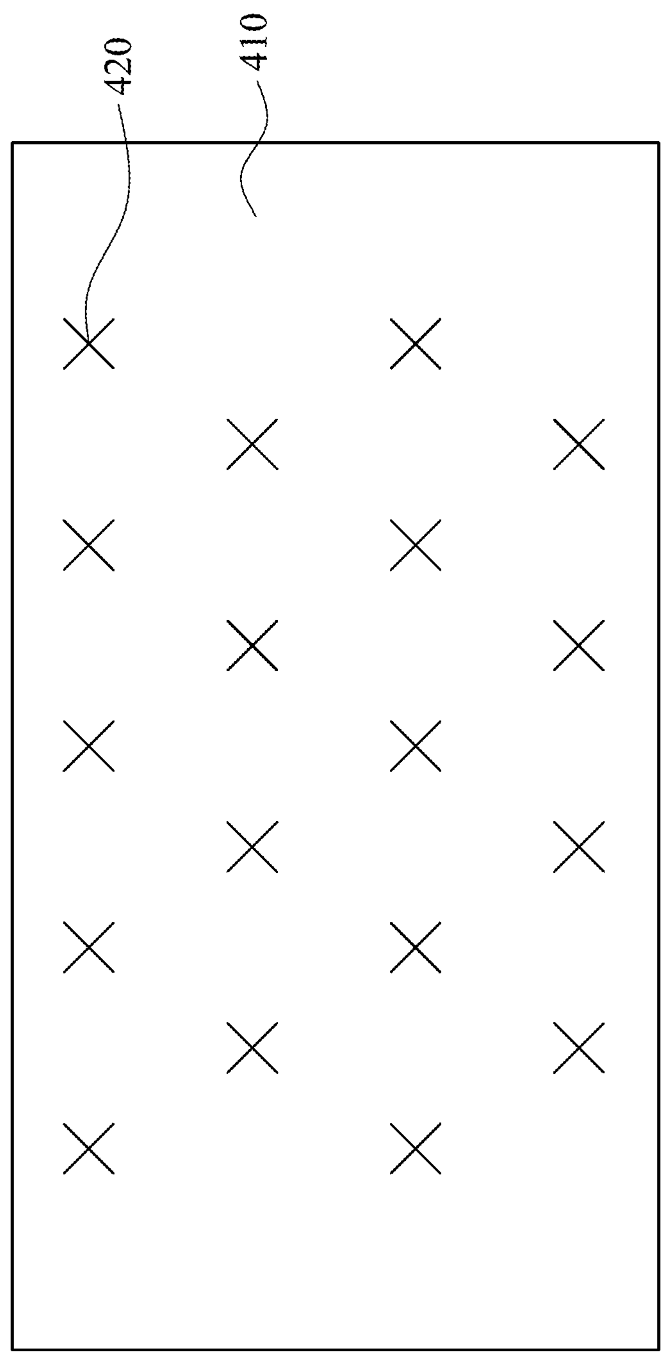
FIG. 6 is a schematic diagram of a display device according to some embodiments of the present disclosure.

Reference is made to FIG. 6. FIG. 6 is a schematic diagram of a display device set 400 according to some embodiments of the present disclosure. The display device set 400 includes at least a substrate 410 and a plurality of test keys 420. In some embodiments for a real application, the substrate 410 is a G8.5 substrate, but should not be limited thereto. G8.5 is one of industrial standards with a size of 2200 millimeter (mm) times 2500 mm. Each of these test keys 420 includes at least a thin film transistor similar to the thin film transistor 110 illustrated by the embodiments shown in FIGS. 1, 3A, 3B, and 5. Since variations during manufacturing the large area substrate (e.g., G8.5 substrate) may be great, there is a hope from the applicants for quick on-line measurements to get the quality (e.g., an interface quality of the channel) of thin film transistors in different regions of that large area G8.5 substrate, so as to fine-tune manufacturing parameters for said large area substrate 410 with thin film transistors thereon.

In some embodiments, when the method 200 is applied to the embodiments as illustrated by FIG. 6, the method 200 further includes sequentially performing the measuring process to a plurality of thin film transistors respectively in each of the test keys 420 on the substrate 410 of the display device set 400. After that, the fitting process is performed to a plurality of output voltages corresponding to the plurality of thin film transistors. In short, the method 200 is applied to each of the test keys 420 on the substrate 410.

By using the method 200 as illustrated and supported by the embodiments illustrated by FIGS. 1 to 5, a rapid gathering and analyzing of the sub-threshold swings SS from the thin film transistors in each of the test keys 420 can be realized because in the measurements to get the sub-threshold swings SS, conventional operations on switching different types of the resistors with various orders of magnitude of resistances (in order to avoid saturation of measurements) connected between the inverting input terminal IP1 and the output terminal O of the operational amplifier 120 can be omitted, which greatly save time of getting one sub-threshold swing SS. Furthermore, measuring errors can be reduced due to that conventional ways of measurements (i.e., measuring by said switching of different types of the resistors), which are "discontinuous" ways of measurements, are omitted and are changed to be "continuous" measurements. The "continuous" herein means data points used for fitting the sub-threshold swing SS are acquired without changing any electronic components in the measuring circuit 100, such that the acquisition of the data points is not interrupted and the measuring circuit 100 can be free from reset during measures of data points for fitting one sub-threshold swing SS. The meaning of "discontinuous" herein is just the opposite of the "continuous", and will not be described in detail. As a result, precise and quick measurements on the production line (i.e., on-line) which result in better quality control can be realized. It is noted that as a driving source for pixels, thin film transistors are likely to be subject to non-uniform characteristics since channels of the thin film transistors are grown amorphously such that a current-to-voltage characteristic may change significantly from one thin film transistor to another. These variations can be inspected by measuring sub-threshold swing of the thin film transistor which originated from the trap states resided in the bandgap of the channel (e.g., the a-Si:H, IGZO, GZO, or IZO channel). Channels of other types of transistors (e.g., a metal-oxide-semiconductor field-effect transistor, MOSFET) are grown with crystallization and have no apparent needs for the on-line measurements mentioned above until now.

As far as the applicants are aware, there is still no obvious need to quickly measure the sub-threshold swings SS on-line for the thin film transistors before the present disclosure is written. The reason is that not until recently a precision of measuring a current by an operational amplifier in a logarithmic current versus gate voltage relation could be down to tens or hundreds of femtoamp scale, which fits the needs in the embodiments of the present disclosure. Besides, some new types of display technologies (e.g., a micro light-emitting diode display technology, but should not be limited thereto) that require a large amount of thin film transistors with high quality and good reliability to drive pixels were developed to a stage which is ready to concern for the on-line quality control of large amount of thin film transistors on the large area substrate until recently. Therefore, quick monitoring and measurement on the thin film transistors become more and more essential.

In summary, a method for rapidly gathering a sub-threshold swing from a thin film transistor which omits switching different types of resistors used to amplify an input voltage from the thin film transistor is provided to enhance precision and efficiency of measuring the sub-threshold swing of the thin film transistor. As such, the method is useful in quality control of thin film transistors on the production line.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method for rapidly gathering a sub-threshold swing from a thin film transistor, comprising:

electrically connecting an operational amplifier and an anti-exponential component to a source terminal of the thin film transistor, wherein a first end of the anti-exponential component is electrically connected to a inverting input terminal of the operational amplifier, a second end of the anti-exponential component is electrically connected to an output terminal of the operational amplifier, a non-inverting input terminal of the operational amplifier is electrically connected to a common mode voltage;

performing a measuring process to the thin film transistor, wherein the measuring process is inputting multiple values of a gate voltage to a gate terminal, such that multiple values of an output voltage are correspondingly generated from the output terminal of the operational amplifier; and performing a fitting process to the output voltage corresponding to the thin film transistor, wherein the fitting process is fitting at least two of said multiple values of the output voltage to get the sub-threshold swing.

2. The method of claim 1, wherein a range of the multiple values of the gate voltage is chosen such that a current flowing through the thin film transistor is within a range from about 1 femtoamp (fA) to about 1 milliamp (mA).

3. The method of claim 1, wherein a range of the multiple values of the gate voltage for the fitting is chosen within a range where a corresponding current flowing through the thin film transistor is within a range from about 0.01 picoamp (pA) to about 0.1 microamp (μA).

4. The method of claim 1, wherein the multiple values of the gate voltage are input in an increasing order.

5. The method of claim 1, wherein the multiple values of the gate voltage are input in a decreasing order.

6. The method of claim 1, wherein the multiple values of the gate voltage are input in an increasing order and followed by a decreasing order.

7. The method of claim 1, wherein the anti-exponential component is a bipolar junction transistor.

8. The method of claim 1, wherein the anti-exponential component is a diode.

9. The method of claim 1, wherein the fitting is performed by a least square method.

10. The method of claim 1, further comprising:

sequentially performing the measuring process to a plurality of thin film transistors other than said thin film transistor, wherein the plurality of thin film transistors are respectively present in a plurality of test keys distributed on a substrate; and performing the fitting process to a plurality of output voltages corresponding to the plurality of thin film transistors.

* * * * *